United States Patent [19]

Hutson

[11] 4,190,853
[45] Feb. 26, 1980

[54] MULTILAYER SEMICONDUCTOR SWITCHING DEVICES

[76] Inventor: Jearld L. Hutson, 2019 W. Valley View La., Dallas, Tex. 75234

[21] Appl. No.: 724,916

[22] Filed: Sep. 20, 1976

Related U.S. Application Data

[63] Continuation of Ser. No. 488,789, Jul. 15, 1974, abandoned.

[51] Int. Cl.$^2$ .......................................... H01L 29/747
[52] U.S. Cl. ......................................... 357/39; 357/55; 357/86
[58] Field of Search .......................... 357/38, 39, 86, 55

[56] References Cited
U.S. PATENT DOCUMENTS

| | | | |
|---|---|---|---|
| 3,360,696 | 12/1967 | Neilson et al. | 357/39 |
| 3,681,667 | 8/1972 | Kokosa | 357/39 |

OTHER PUBLICATIONS

A. Lebedev, "Analysis of Processes in Multilayer Semiconductor Structures of the N-P-N-P-N-P Type," Physics of P-N Junctions and Semiconductor Devices, 2nd ed., London, Eng., 1971, pp. 321–329.

*Primary Examiner*—Joseph E. Clawson, Jr.
*Attorney, Agent, or Firm*—Richards, Harris & Medlock

[57] ABSTRACT

The specification discloses semiconductor switching devices having more than five layers of alternating semiconductor conductivity types and which do not utilize substantial lateral switching currents during the operation thereof. Ones of the exterior layers of the devices are heavily doped. In one embodiment of the invention, an asymmetrical regenerative semiconductor switch is disclosed which operates in the general manner of a silicon controlled rectifier but which includes two blocking junctions therein. In another embodiment of the invention, a semiconductor switching device having symmetrical switching operation is disclosed.

6 Claims, 15 Drawing Figures

MULTILAYER SEMICONDUCTOR SWITCHING DEVICES

This is a continuation of copending U.S. application Ser. No. 488,789, filed July 15, 1974 now abandoned.

FIELD OF THE INVENTION

This invention relates to semiconductor devices and more particularly relates to multilayer semiconductor switching devices.

THE PRIOR ART

Two basic types of semiconductor switching devices have long been utilized for a variety of electronic control applications. A first type of such semiconductor switches are asymmetrical regenerative devices such as the silicon controlled rectifier (SCR) having four regions of alternate electrical conductivity types to provide switching in a single direction. The construction and operation of a typical SCR is described in chapter one of the General Electric Silicon Controlled Rectifier Manual, Second Edition, Copyright 1961, by the General Electric Company and an article by Moll, Tannenbaum, Goldey and Holenyak in the "Proceedings of the I.R.E.", Sept. 1966, Vol. 44, Page 1174–1182. Various improvements in a controlled rectifier are also disclosed and claimed in U.S. Pat. No. 3,475,666, issued Oct. 28, 1969, and in U.S. Pat. No. 3,524,114, issued Aug. 11, 1970, by the present applicant.

A second type of switching device is a symmetrical switch commonly termed the triac and heretofore has comprised five layers of alternating semiconductor type. Four of the layers have been utilized for switching or conducting during one-half cycle of an A.C. voltage source, and three of these same layers and a fifth layer are used for conducting during the alternate half cycle of the voltage source. Descriptions of the construction and operation of such five layer triac devices may be found in U.S. Pat. No. 3,275,909, issued Sept. 27, 1966 to F. W. Gutzwiller and U.S. Pat. No. 3,317,746, issued May 2, 1967 and U.S. Pat. No. 3,475,666 issued Oct. 28, 1969 to the present applicant.

Although such previously developed SCR and triac devices have generally worked well in practice, a need has arisen for semiconductor switching devices having improved operational characteristics. For example, it has become desirable to provide asymmetrical and symmetrical semiconductor switches having increased voltage capacity and improved commutating and static dv/dt characteristics. In addition, it has become desirable to fabricate an entire IC circuit, including a semiconductor switch, on a single substrate.

SUMMARY OF THE INVENTION

The present invention is directed to a semiconductor switching device which substantially eliminates and reduces problems heretofore associated with prior SCRs and triacs. In particular, the present device eliminates lateral switching current which have tended to reduce the switching sensitivity of prior devices. The present multilayer switching devices also include additional blocking junctions which substantially improve the operating characteristics of the devices.

In accordance with the present invention, an asymmetrical regenerative semiconductor switch includes a semiconductor body having six layers of alternating first and second opposite conductivity types to form a plurality of P-N junctions. The external layers of the body are of opposite conductivity types. A seventh layer of the first conductivity type is formed in a portion of the external layer of the second conductivity type. A first electrode contacts the seventh layer. A second electrode contacts the external layer of the second conductivity type and a third electrode contacts the external layer of the first conductivity type.

In accordance with another aspect of the invention, a portion of one of the interior first type layers of the device previously described extends through the exterior layer of the second conductivity type to the exterior of the body. A groove is then formed in the external layer of the second conductivity type and is disposed between the exterior portion of the interior layer and the external layer of the second conductivity type.

In accordance with another aspect of the invention, a semiconductor switch device having symmetrical switching operations includes a body of semiconductor material having five layers of first and second opposite conductivity types which are interleaved with one another to form a plurality of P-N junctions, such that the two external layers of the body are of first conductivity types. Heavily doped regions of first and second conductivity types are formed over a portion of one of the external layers. First and second electrodes contact the heavily doped regions. An area of the second conductivity type is formed over a portion of the other of the external layers and a third electrode contacts the area.

In accordance with a more specific aspect of the invention, a semiconductor switch having symmetrical switching characteristics includes a body of semiconductor material having five layers of alternating first and second opposite conductivity types to form a plurality of P-N junctions. The body includes two external layers of the first conductivity type. A pair of heavily doped regions of the first conductivity type are formed in one of the external layers and are spaced apart by a pair of heavily doped regions of the second conductivity type. First and second electrodes each contact one of the heavily doped regions of the first conductivity type and one of the heavily doped regions of the second conductivity type. A heavily doped region of the first conductivity type is formed in the other of the external layers. A heavily doped region of the second conductivity type is also formed in the other of the external layers. A third electrode contacts each of the heavily doped regions in the other of the external layers to form a three terminal switching device.

In a more specific aspect of the embodiment described above, a first groove extends through one of the external layers and is disposed between the regions of first and second conductivity type. A second groove extends through the other of the external layers and is disposed between the heavily doped regions.

In another aspect of the invention, an electronic switching device in combination with an electrical circuit includes a semiconductor body having a plurality of layers of alternating opposite conductivity type. A channel is formed on an exterior surface of the body and extends through one of the layers to geometrically and electrically isolate two areas on the body. Electrodes are formed on one of the areas on one side of the channel to form a switching device. Semiconductor regions and electrodes are formed on the other side of the body on the other side of the channel to form electrical circuitry which operates independently, in at least one mode, of the switching device.

In accordance with a more specific aspect of the invention, a semiconductor switch and associated circuitry formed in a unitary semiconductor body include five layers of alternating first and second semiconductor conductivity types, the external layers being constructed from said first conductivity type. A channel is formed across one of the external layers and extends through a plurality of the layers to geometrically and electrically isolate first and second areas of the body. Regions of the second conductivity type are formed over the external layers in the first layer. Electrodes contact at least one of the external layers and the regions of the second conductivity type to form a semiconductor switch in the first area. At least one region of the second conductivity type is formed in one of the external layers in the second area. Electrodes contact one of the external layers and the regions in the second area to form at least one electronic device which is geometrically and electrically isolated from the semiconductor switch.

DESCRIPTION OF THE DRAWINGS

For a more complete understanding of the present invention and for further objects and advantages thereof, reference is now made to the following description taken in conjunction with the accompanying Drawings, in which.

DESCRIPTION OF THE PREFERRED EMBODIMENT

Figure 1:
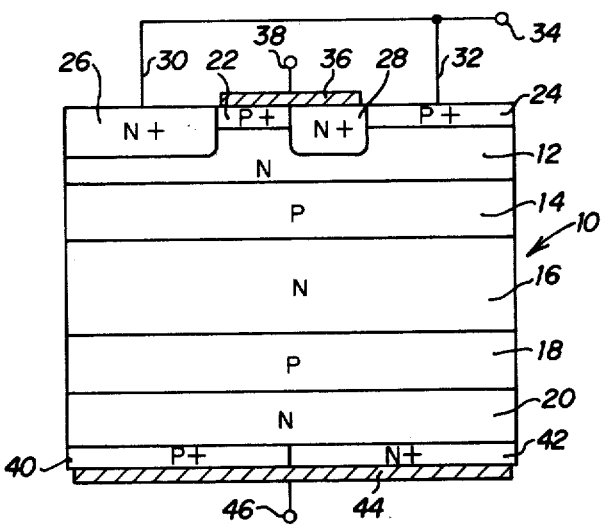
FIG. 1 is a diagrammatic section view of a seven layer symmetrical switching device according to the invention.

Referring to FIG. 1, a sectional view of a symmetrical switching device providing improved operational characteristics over a conventional five layer triac device is illustrated. The device comprises a semiconductor body 10 comprised of five layers 12-20 alternating opposite conductivity types. For example, layers 12, 16 and 20 are of N-type semiconductor material and are interleaved with layers 14 and 18 of P-type conductivity semiconductor material. Layers 12-20 thus form four P-N rectifying junctions.

Two regions 22 and 24 of heavily doped P+ type material are formed by diffusion into the external surface of the layer 12. Regions 22 and 24 are spaced apart by two regions 26 and 28 of N+ conductivity material. Electrodes 30 and 32 connect regions 24 and 26 and are commonly joined to form a gate terminal 34. A metal electrode 36 shorts across regions 22 and 28 to provide a first anode terminal 38.

A region 40 of P+ type material is formed in the external surface of layer 20 and is disposed adjacent a region 42 of N+ type material. A third metal electrode 44 contacts both regions 40 and 42 to provide a second anode terminal 46.

The semiconductor body 10 shown in FIG. 1 may be formed in any suitable manner according to techniques well known in the art. For example, an N-type electrical conductivity silicon wafer may be diffused on both sides in various steps to form the five layers 12-20. The P+ and N+ regions 22-28 may then be formed in layer 12 by conventional diffusion techniques using suitable dopants or impurities which are compatible with the particular semiconductor material being operated upon. Similarly, the regions 40 and 42 may be diffused into layer 20 in a similar manner. The particular size and shapes of the diffused regions are of course determined by suitable masking and photographic techniques conventionally employed in semiconductor diffusion technology. It will be understood that any suitable semiconductor material may be utilized to form devices according to the invention, but for clarity of illustration, reference will be made in the Drawings to particular electrical conductivity types and to silicon as the material being utilized. It will of course, however, be understood that the electrical conductivity types herein specified may be interchanged and reversed.

Figure 2:
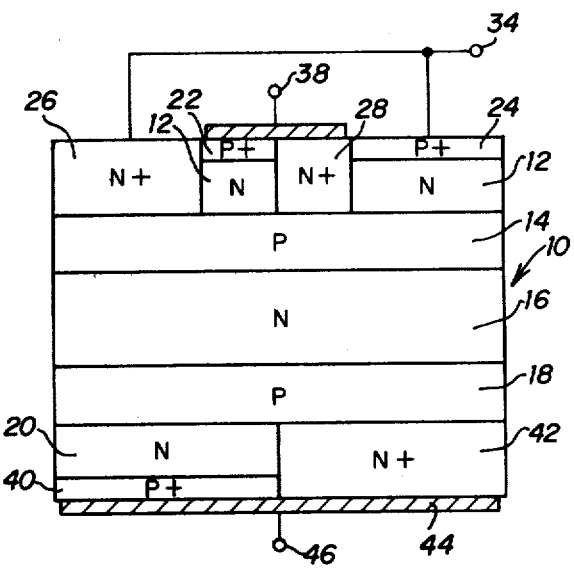
FIG. 2 is a diagrammatic section view of a variation of the seven layer switching device shown in FIG. 1.

FIG. 2 illustrates a variation of the device shown in FIG. 1, and common numerals are utilized for like and corresponding parts in the two FIGURES. The device shown in FIG. 2 is constructed in a similar manner as the device shown in FIG. 1, except that the N+ type regions 26, 28 and 42 have been increased in thickness and extend completely through the N-type layers 12 and 20.

Figure 3:
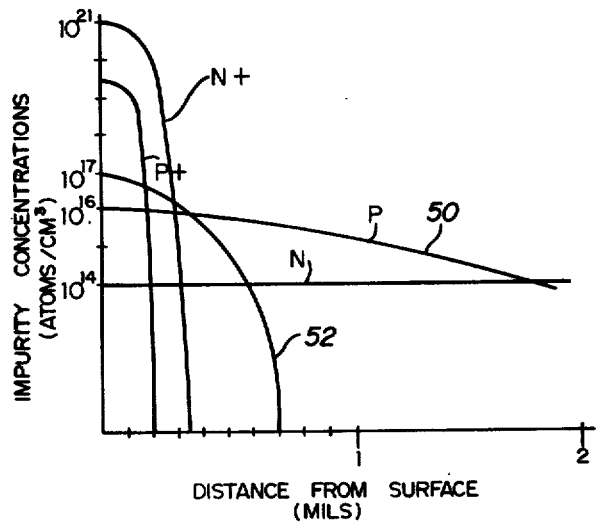
FIG. 3 is a diagram illustrating the impurity profile of the devices shown in FIGS. 1 and 2.

FIG. 3 is an impurity profile graph illustrating the doping levels of the various layers of the devices shown in FIGS. 1 and 2. Referring to FIG. 3, an initial silicon slice was utilized which had an approximate impurity concentration of about $10^{14}$ atoms/c.c. that ultimately formed the interior N-type later 16. The P layers 14 and 18 were then diffused with a long sloping junction illustrated by the line 50 with an impurity concentration of approximately $10^{16}$ atoms/c.c. to provide a junction of approximately 2 mils in thickness. The N layers 12 and 20 were then formed with thicknesses of approximately 0.7 mils and having an impurity concentration of approximately $10^{17}$ as illustrated by line 52. The P+ layers 22, 24 and 40 were provided with an impurity concentration of between $10^{19}$ and $10^{21}$ and were provided with a depth of approximately 0.2 mils. The N+ regions 26, 28 and 42 were provided with an impurity concentration of approximately $10^{21}$ or greater and were diffused to a depth of approximately 0.3–0.5 mils in the embodiment shown in FIG. 1 and with a depth of approximately 0.7 mils in the embodiment shown in FIG. 2.

In operation of the devices shown in FIGS. 1 and 2, it will be assumed that the terminal 46 is negative and the gate terminal 34 is negative with respect to the anode terminal 38. Although the operation of the present device is not fully understood, it is believed that the N+ region 28 emits into the P-type layer 14. The current carriers drift back into the slightly doped N layer 12 into the heavily doped P+ layer 24. This operation effectively forms an NPNP device which is "turned on".

Figure 4:
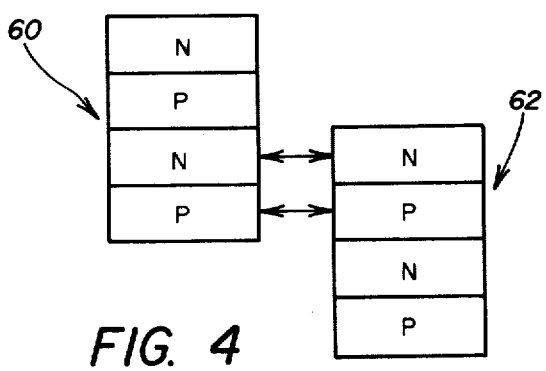
FIG. 4 is a diagrammatic illustration of a mode of operation of the device shown in FIGS. 1 and 2.

Referring to FIG. 4, a diagrammatic illustration of the operation of the device is shown. The regions 28 and layers 14, 12 and 24 form an NPNP device 60. The bottom NP stages of device 60 are shared, or are common, with a second NPNP device 62 which comprises the remainder of the layers shown in the devices of FIGS. 1 and 2. Once the NPNP device 60 becomes conductive, the entire device 62 is turned on by a "domino effect". A very important aspect of the invention is that substantial lateral switching currents are not required during the operation of the device in this mode. This contrasts with previously developed five layer triac devices wherein lateral switching currents along P-N junctions provide the basis of switching operations.

An analogy of operation of the device in this mode is a conducting conventional four layer SCR in series with a saturated NPN transistor. Consequently the forward voltage characteristics of the device are quite good. In addition, the voltage sensitivity of the device shown in FIGS. 1 and 2 is superior to conventional triac devices.

The present device is thus provided with a regenerative gate region and provides double injection from a single side into the other regions of the device. This regenerative gate comprises the heavily doped N+ region 28 in association with the P+ layer 24.

Due to the additional semiconductor layers provided in the present device, the voltage capacity of the present device is superior to conventional five layer triacs. In addition, the static and commutating dv/dt of the present device are superior to conventional triac devices.

Another important aspect of the present invention is that extremely good temperature characteristics are provided by the present invention, without the requirement of shorting techniques. Inasmuch as most of the temperature stability of the devices are controlled by the outer NPN regions of the device, the emitter efficiency of the N emitter is made relatively low to provide low Beta characteristics at low current levels. The N+ regions of the device are provided to provide improved forward voltage characteristics. Thus, at low current levels, the lightly doped intermediate N-type layer appears as the emitter and the resulting Beta of the device is relatively low, thereby providing good temperature stability characteristics. At high current levels of the device, the N+ region operates as the emitter to provide good on voltage characteristics.

The devices shown in FIGS. 1 and 2 in the preferred embodiment are provided with a total thickness of approximately 8–12 mils, which is substantially thicker than the conventional five layer triac devices. However, the present devices have been found to gate at relatively low gating currents in all four quadrants. This phenomena is thought to occur due to the fact that no transverse switching currents are required for the operation of the present device.

Figure 5:
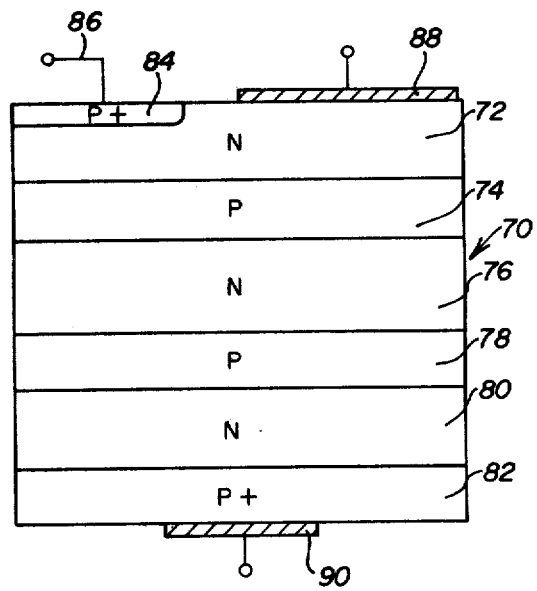
FIG. 5 is a diagrammatic view of an asymmetrical regenerative semiconductor switch according to the invention.

FIG. 5 illustrates an asymmetrical regenerative semiconductor device constructed in accordance with the invention. The device shown in FIG. 5 includes a semiconductor body 70 comprised of six layers of alternating conductivity type 72–82. Layers 72, 76 and 80 are formed of N-type conductivity material, while layers 74, 78 and 82 are composed of P-type conductivity material. Layer 82 is provided with heavily doped P-type material having an impurity concentration of in the region of $10^{-19}$ as previously shown in FIG. 3. In addition, a seventh layer 84 of heavily doped P+ material 84 is formed as by diffusion into the exterior surface of layer 72. A gate electrode 86 is formed in contact with the region 84, while a metal electrode 88 contacts the N-type layer 72 to form a cathode. A metal electrode 90 contacts the P+ layer 82 to form an anode terminal. Although the operation of the device shown in FIG. 5 is not completely understood, the device essentially operates as a three terminal SCR type device. Once the device is placed into conduction, the device essentially operates as two four layer NPNP devices, with two of the stages being shared. In operation, the region 84 injects into layer 74 and a regenerative action, somewhat similar to that previously described, is provided.

An important aspect of the present invention is that the SCR type device shown in FIG. 5 is provided with two blocking junctions in the forward blocking mode rather than a single blocking junction as in conventional SCR devices. In particular, the device shown in FIG. 5 is provided with a blocking junction formed between layers 74 and 76 and between layers 78 and 80. This provides substantially higher voltage capacity for the present device. Moreover, the static dv/dt of the device shown in FIG. 5 is improved over conventional SCRs because the capacitance of the device is effectively split into two series capacitors rather than effectively placed in a single capacitor. The device shown in FIG. 5 may be formed with dimensions and doping concentrations similar to that previously described to form a body of approximately 12 mils thick. However, the device performs gating at very low currents even in view of the relatively thick dimensions.

Figure 6:
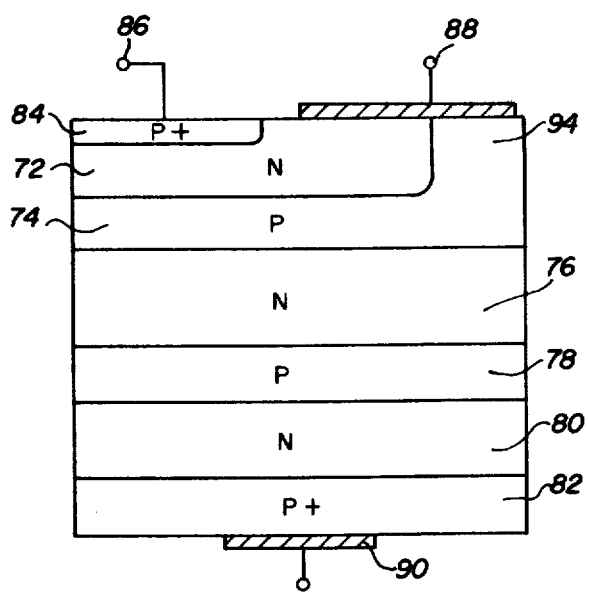
FIG. 6 is a sectional diagrammatic view of a variation of the device shown in FIG. 5.

FIG. 6 is a variation of the device shown in FIG. 5, with like numerals being utilized for like and corresponding parts. The device shown in FIG. 6 is identical to that shown in FIG. 5, with the exception that the interior P-type layer 74 includes a portion 94 which extends through the N layer 72 to the external surface of the device. A P-N junction is thus formed between the layers 72 and 94 which is shorted by the electrode 88.

Figure 7:
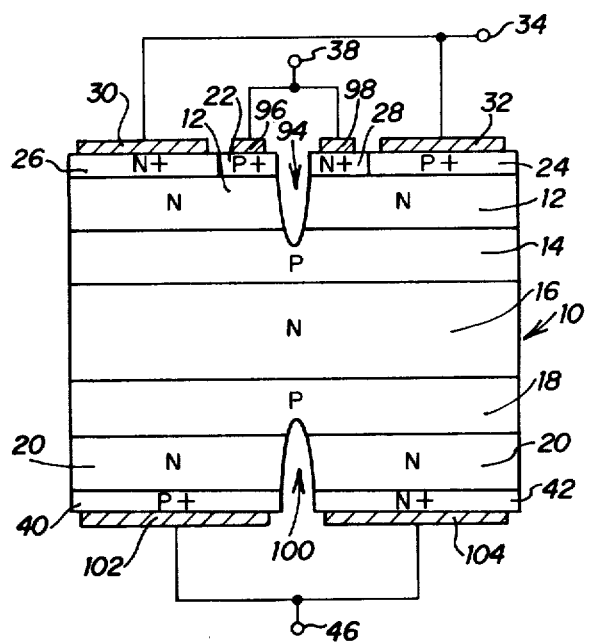
FIG. 7 is a sectional diagrammatic view of a variation of the devices shown in FIGS. 1 and 2.

FIG. 7 illustrates an alternate embodiment of the symmetrical switching device shown in FIG. 1, with like numerals being utilized for like and corresponding parts. From an inspection of FIG. 7, it will thus be apparent that the device is identical to the device shown in FIG. 1, with the exception of a first groove 94 which extends between the P+ region 22 and the N+ region 28 and extends completely through the N layer 12 into the P layer 14. In this manner, the P+ region 22 and N+ region 28 are isolated from one another. Electrodes 96 and 98 are respectively connected to regions 22 and 28 and are interconnected to form a terminal 38. Similarly, a second groove 100 is formed between the P+ layer 40 and N− region 42. The groove 100 extends completely through the N layer 20 into the P-type layer 18 in order to completely separate and isolate the N+ region 42 from the P+ layer 40. Electrodes 102 and 104 are respectively connected to P+ layer 40 and N+ region 42 and are interconnected to form the terminal 46.

Figure 8:
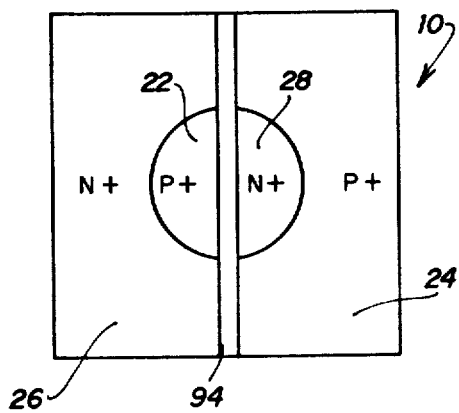
FIG. 8 is a top view of the device shown in FIG. 7.

FIG. 8 illustrates a top view of the device shown in FIG. 7, wherein it may be seen that the device is symmetrical. The P+ region 22 and N+ region 28 each comprise one-half of a circle and the groove 94 extends completely across the entire body 10 to separate the N+ region 26 from the P+ layer 24. The operation of the device shown in FIGS. 7 and 8 is similar to that previously described with respect to the devices shown in FIGS. 1 and 2, with the previously noted benefits in operation and performance being provided.

Figure 9:
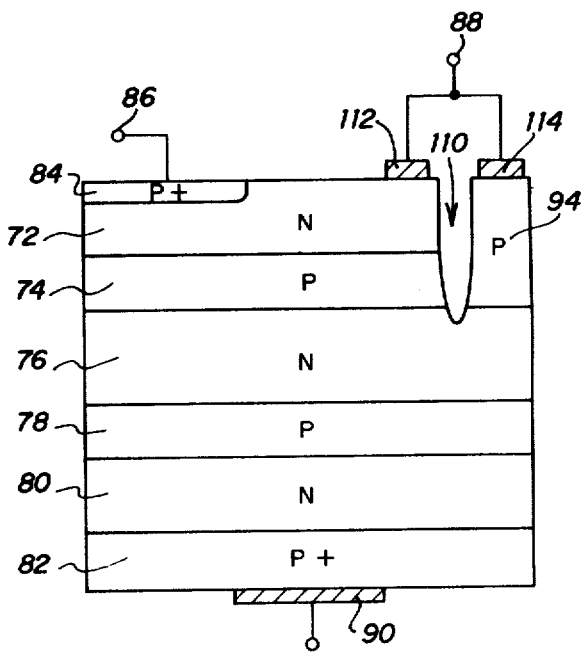
FIG. 9 is a sectional diagrammatic view of a variation of the asymmetrical device shown in FIG. 6.

Referring to FIG. 9, a variation of the asymmetrical regenerative switch shown in FIG. 6 is illustrated. Like numerals are utilized for like and corresponding parts, and it will be seen that this device is identical to that shown in FIG. 6, with the exception of a groove 110 which is disposed between the layers 72 and the regions 94 of the P-type layer 74. The groove 110 extends completely through the layers 72 and 74 into the N-type layer 76 in order to completely isolate the layers 72 and 74 from the region 94. An electrode 112 contacts the N-type layer 72, while an electrode 114 contacts the P-type region 94. Electrodes 112 and 114 are interconnected to form the terminal 88. The device shown in FIG. 9 operates in substantially the same manner as the device shown in FIG. 6.

Figure 10:
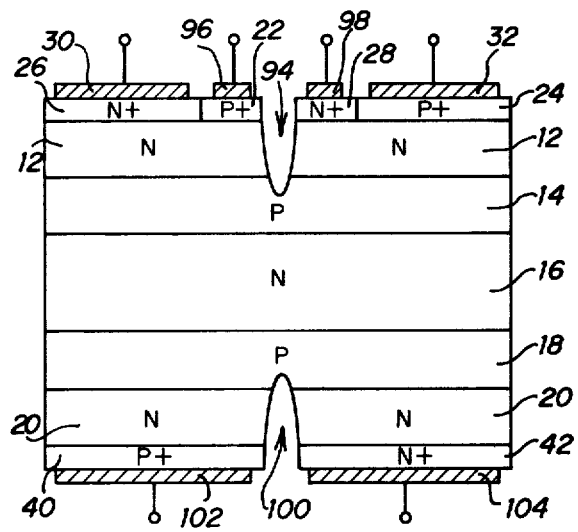
FIG. 10 is a sectional view of a variation of the symmetrical device shown in FIG. 7.

FIG. 10 illustrates a variation of the device shown in FIG. 7, with like numerals being utilized for like and corresponding parts. As may be seen, the device shown in FIG. 10 is identical to that shown in FIG. 7, with the exception that electrodes 30, 32, 96, 98, 102 and 104 are not connected. The device shown in FIG. 10 may be fabricated in the manner illustrated and shipped to the ultimate user. The ultimate user may the connect the various electrodes in a variety of different configurations to provide various desired functions. For example, the electrodes on one side of the grooves 94 and 100 may be interconnected to form one device, while the electrodes on the other side of the groove may be interconnected to form a second device. Alternatively, the electrodes may be interconnected to form the three terminal device shown in FIG. 7.

Figure 11:
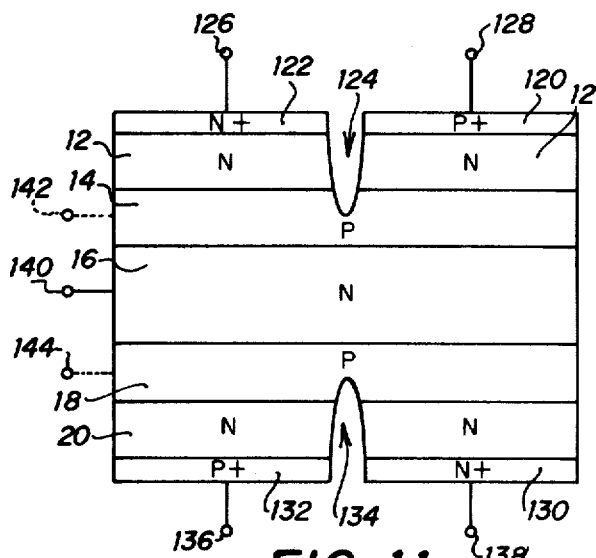
FIG. 11 is a sectional view of another embodiment of the invention which employs internal switching.

FIG. 11 illustrates another variation of the present device, with like numerals being utilized for like and corresponding parts previously identified. Thus, the five layers 12-20 are formed in the manner previously described, with the P+ region 120 being separated from an N+ region 122 by a channel or groove 124. Electrodes 126 and 128 contact regions 120 and 122, respectively. A region 130 of N+ type material is separated from a region 132 of P+ type by a channel 134. Electrode 136 contacts region 132, while electrode 138 contacts region 130.

An important aspect of the device shown in FIG. 11 is the provision of electrode connection to the interior layers of the device. Consequently, an electrode 140 may be connected to the interior layer 16. Alternatively, electrodes 142 and 144 may be connected to interior P-type regions 16 and 18. The device shown in FIG. 11 may be operated in a similar manner as devices previously described, except that the device may be fired by application of a suitable voltage to the electrode 140, or alternatively to the electrodes 142 and 144.

Figure 12:
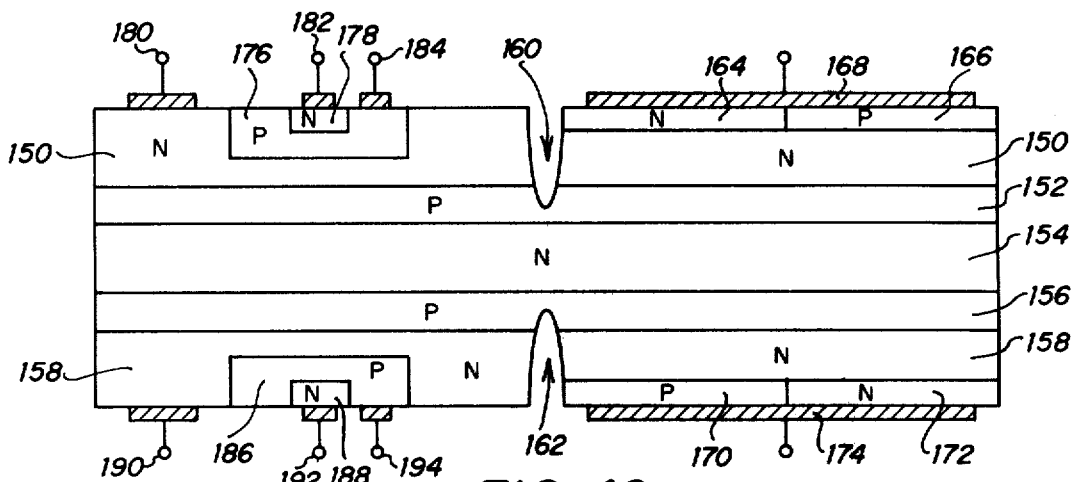
FIG. 12 is a sectional diagrammatic view of another embodiment of the invention including a semiconductor switching device formed in a single body with two NPN transistors.

FIG. 12 illustrates another embodiment of the present invention wherein a multilayer switching device of the present invention may be formed in a single semiconductor body along with other electronic circuits which may be operated in at least one mode independently to the switching device. Referring to FIG. 12, the device comprises a unitary semiconductor body comprised of five layers 150, 152, 154, 156 and 158 of alternating opposite semiconductor types. Layers 150, 154 and 158 comprise N-type semiconductor material, while layers 152 and 156 comprise P-type. A groove or channel 160 is formed across a first external surface of the device and extends into layer 152 to geometrically and electrically isolate the body into two areas. Similarly, a channel 162 is formed in a second external surface of the body and extends into layer 156 in order to isolate a second external surface into two areas. The area of the body on one side of the channels 160 and 162 is constructed to form a semiconductor switching device and includes a region 164 of N+ type material and a region 166 of P+ type. An electrode 168 shorts across regions 164 and 166. Regions 164 and 166 are separated by a channel 167, while regions 170 and 172 are separated by a channel 173 in the manner of the device previously shown in FIG. 11. A region 170 of P+ type material is formed adjacent a region 172 of N' type material on the exterior surface of layer 158. Regions 170 and 172 are shorted by an electrode 174. The illustrated device thus forms a two terminal switching device operable as a diode.

Two NPN transistors are formed in the second area of the body to the left of the channels 160 and 162. The first transistor is formed in the N-type layer 150 by a diffusion region 176 of P-type material and a diffused region 178 of N-type material. Electrodes 180, 182 and 184 contact the regions to form a conventional NPN transistor. On the opposite side of the device, a second transistor is formed by a region 186 of P-type material and a diffusion region 188 of N-type material. Electrodes 190, 192 and 194 are formed in the manner illustrated to provide a conventional NPN transistor. The device illustrated in FIG. 12 may thus be utilized to perform switching functions completely independently of operation of the two NPN transistors, or alternatively, the transistors may be interconnected to operate in one mode independently of the switching device and to provide switching action to the switching device in a second mode.

Figure 13:
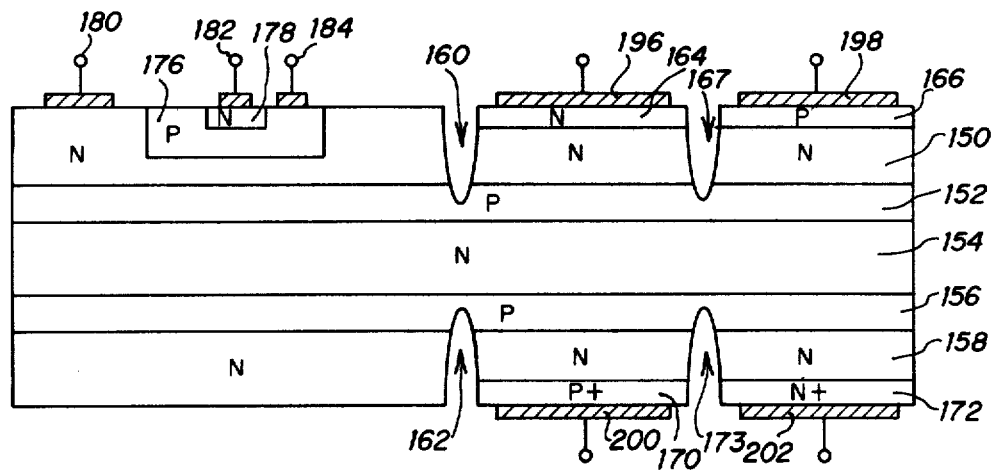
FIG. 13 is a diagrammatic sectional view of a variation of the circuit shown in FIG. 12.

FIG. 13 illustrates a variation of the device shown in FIG. 12, with like numerals being utilized for like and corresponding parts. Thus, the semiconductor body is divided into two isolated areas by the channels 160 and 162. A switching device is formed from layers 150-158 and regions 164-166 and 170-172. Electrodes 196 and 198 contact regions 164 and 166 respectively, while electrodes 200 and 202 connect with regions 170 and 172. A four terminal switching device is thus provided on the right hand side of the semiconductor body. It will be understood that the four terminals may be interconnected in several of the different modes to provide different types of switching functions.

A single NPN transistor is formed in the other area of the device by P-type region 176 and N-type region 178. Electrodes 180, 182 and 184 are provided to provide the three terminal transistor connections.

Figure 14:
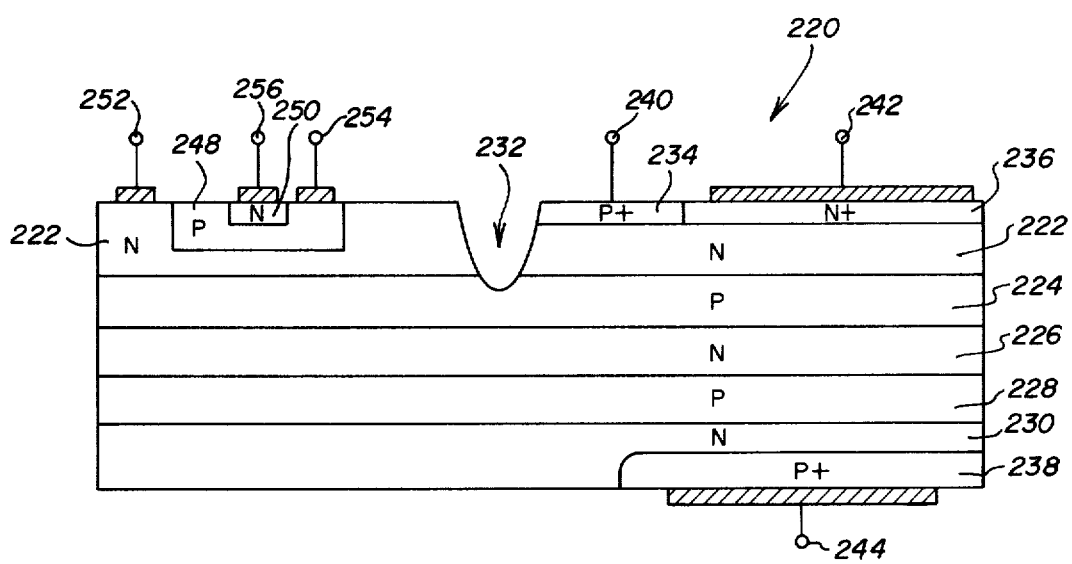
FIG. 14 is a sectional view of an asymmetrical semiconductor switching device formed in a single body with an NPN transistor.

Referring to FIG. 14, a device indicated generally by the numeral 220 comprises a unitary semiconductor body comprised of five layers 222-230 of alternating opposite semiconductor type. Layers 222, 226 and 230 comprise N-type material, while layers 224 and 228 comprise P-type semiconductor material. A groove or channel 232 is formed across an external surface of layer 222 and extends through layer 222 into layer 224 in order to geometrically and electrically isolate the body into two areas. In the first area, an asymmetrical switching device is formed by a P+ region 234 which is formed adjacent an N+ type region 236 in the upper portion of N-type layer 222. A P+ type layer 238 is formed in a portion of the N layer 230. An electrode 240 contacts the P+ region 234, an electrode 242 contacts the N+ region 236, and an electrode 224 contacts the P+ region 238. The switching device thus formed in the first area of the body operates in the same manner as the device previously described with respect to FIG. 5.

In the second region of the body formed by the channel 232, a transistor is formed by a first diffused P-type region 248 and a diffused N-type region 250 formed in the conventional manner. An electrode 252 contacts layer 222, an electrode 254 contacts region 248 and an electrode 256 contacts region 250. Layer 222 and regions 248 and 250 thus operate as a conventional NPN transistor.

FIG. 14 thus illustrates two different semiconductor devices formed on the same substrate and which are operable independently of one another due to the geometrical and electrical isolation provided by the channel 232. If desired, the transistor formed in the second region of the body may be operated and interconnected to control the firing of the asymmetrical switching device formed in the first area of the body.

Figure 15:
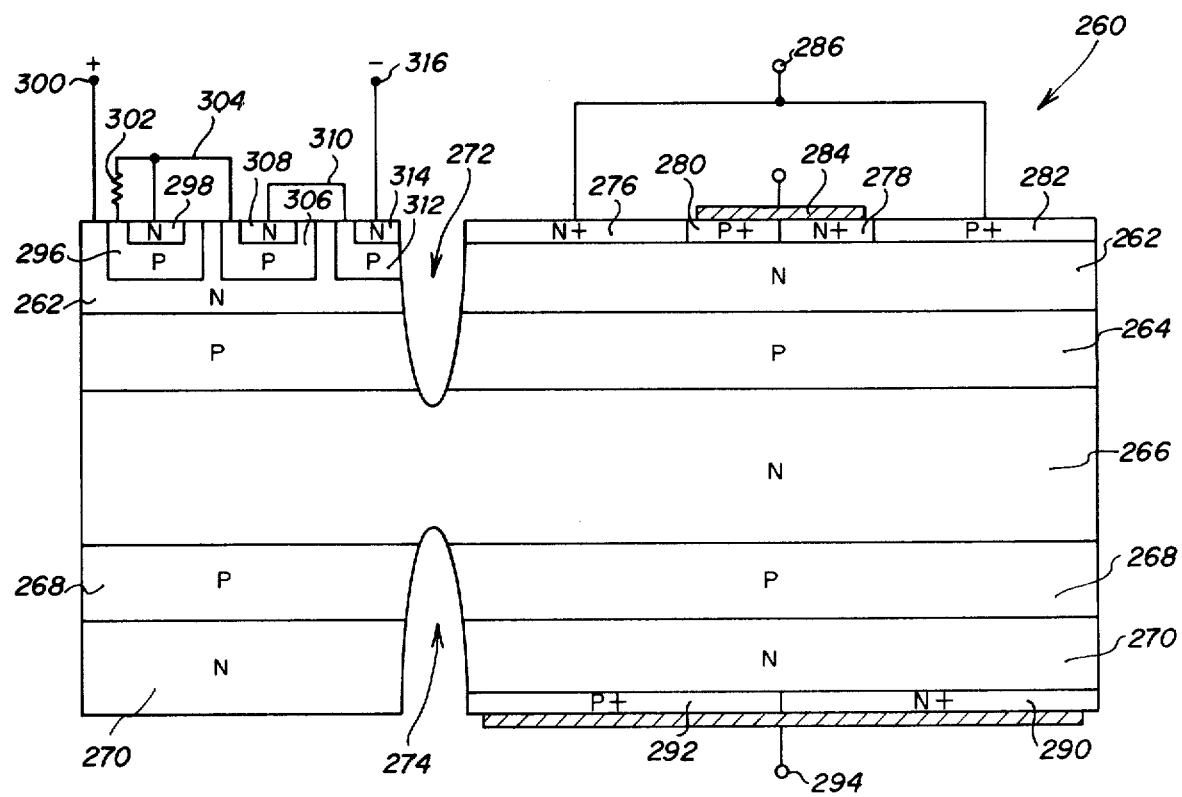
FIG. 15 is a sectional view of a symmetrical switch formed in the same semiconductor body as an electrical light sensitive circuit.

FIG. 15 illustrates another example of a semiconductor switch formed on the same semiconductor body with independent electronic circuitry. FIG. 15 illustrates a device illustrated generally by the numeral 260 and which comprises five layers of alternating opposite conductivity 262-270. Layers 262, 266 and 270 comprise N-type semiconductor material, while layers 264 and 268 comprise P-type semiconductor material. Channels 272 and 274 are aligned with one another and extend through layers of the device into the N-type layer 266 as illustrated. Channels 272 and 274 thus serve to geometrically and electrically isolate the body into two different areas. In the first area, a symmetrical regenerative switching device similar to that previously shown in FIGS. 1 and 2 is formed. Thus, N+ type regions 276 and 278 are formed over layer 262, and adjacent P+ type regions 280 and 282. An electrode 284 contacts regions 278 and 280, while an electrode 286 contacts regions 276 and 282 in the manner previously described. An N+ region 290 and a P+ region 292 are adjacently formed over the N layer 270 and are interconnected by an electrode 294. The illustrated three terminal device thus operates in the manner previously disclosed with respect to FIGS. 1 and 2.

In the second area of the body formed by channels 272 and 274, an NPN phototransistor is formed by a diffused P region 296 and an N diffused region 298. Positive voltage is applied to the device via an electrode 300. A base emitter resistor 302 is connected to the P-type region 296 and is interconnected with the N-type region 298 in the manner illustrated. The regions are then interconnected through a lead 304 to a P-type region 306 which is formed in the layer 262. An N-type region 308 is formed in region 306 and is interconnected via a lead 310 with a P-type region 312. An N-type region 314 is connected via an electrode 316 to receive a negative voltage. Circuitry formed in the second area of the body thus comprises a light sensitive circuit for controlling the operation of the symmetrical switching device. Incident light is detected by the NPN prototransistor comprised of regions 296 and 298 and layer 262 and the output of the transistor is applied to a Darlington connected transistor configuration provided by the regions 306 and 308. The output of the transistor configuration is then applied to a four layer NPNP switch formed by regions 312 and 314 and layers 262 and 264. When the incident light sent by the transistor exceeds the predetermined value, the NPNP switch conducts to apply current to the N-type layer 266 in order to turn on the switching device formed by electrodes 284, 286 and 294.

An important aspect of the invention is that the N-type layer 266 normally does not have a substantial amount of carriers therein, due to the isolation provided by the channels 272 and 274. The junction between layers 264 and 266 provides isolation during one-half of an alternating cycle signal applied to the switching device, while the junction between layers 262 and 264 provides isolation to the other half cycle of the alternating signal. This isolation is provided to both areas of the body. Of course, when the switching device of the system fires, the device is not required to be electrically isolated and carriers are injected into the N-type layer 266. The present device thus provides an entire light sensitive switching network which may be provided on a single semiconductor body, as well as providing the operational characteristics of the switching device which have previously been described.

It should be understood that in place of a light sensitive electronic circuit such as shown in FIG. 15, that circuitry responsive to a magnetic field could alternatively be utilized. For example, a Hall effect device may be utilized to detect an incident magnetic field in order to cause the switching device 260 to be fired. It will also be understood that a wide variety of electronic circuits may be formed in the devices shown in FIGS. 12-15, and the transistors illustrated may be replaced by field effect transistors, MOSFETs, Hall effect devices, charge coupled devices and the like.

An important aspect of the invention is that the switching devices shown in FIGS. 12-15 may be turned on by any one of several modes. For example, the symmetrical switching device 260 shown in FIG. 15 may be turned on through the layer 266 by the application of an external pulse to the layer 266, or by the injection of carriers into the layer 266 which turn on one of the sides of the device.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor switch device having symmetrical bidirectional switching characteristics but nonsymmetrical construction comprising:
   a body of semiconductor material having five layers of alternating first and second opposite conductivity types to form a plurality of P-N junctions, said body having two outer layers of said first conductivity type,
   a pair of spaced apart heavily doped discrete regions of said second conductivity type being formed in portions of one of said outer layers to form a sixth layer defining an exterior surface of said body, first isolating means extending through said one of said outer layers and disposed between said regions of said second conductivity type in order to electrically isolate said regions from one another, first and second electrodes contacting said heavily doped regions, third and fourth electrodes contacting said one outer layer of opposite sides of said first isolating means, a heavily doped discrete region of said second conductivity type formed in and covering a portion of the other conductivity type formed in and covering a portion of the other of said outer layers to form a seventh layer defining another exterior surface of said body, second isolating means extending through said other outer layer and disposed between said heavily doped region and the exterior surface of said other outer layer, said body thus formed including one portion having six layer of alternating opposite conductivity types and a second portion having seven layers of alternating opposite conductivity types, said switch operable in response to electrical signals applied to said electrodes to provide bidirectional symmetrical switching action at a high commutating rate, a fifth electrode contacting said heavily doped region in said other outer layer, and a sixth electrode contacting the exterior surface of said other outer layer on the opposite side of said second isolating means from said heavily doped region.

2. The semiconductor switch device of claim 1 wherein said first and fourth electrodes are connected to form a gate electrode, said second and third electrodes are connected to form a first anode and said fifth and sixth electrodes are connected to form a second anode.

3. The semiconductor switch device of claim 1 and further comprising a pair of heavily doped regions of said first conductivity type spaced on the exterior surface of said outer layer, one of said regions of said first conductivity type disposed between said pair of heavily doped regions of said second conductivity type and said regions of said first conductivity type disposed on opposite sides of said first groove.

4. A bidirectional gated semiconductor switch having nonsymmetrical construction but having symmetrical switching operation when connected to receive electrical biasing and control signals, said switch comprising:

a monolithic body of semiconductor material having a first region encompassing approximately one-half of said body and a second region encompassing the other approximate half of said body, said first region having seven layers of alternating conductivity types to form six P-N junctions and said second region having six layers of alternating conductivity types to form five P-N junctions, a first exterior surface of said first and second regions each having portions of first and second conductivity types, isolating means on said exterior surface separating said first and second regions, a second opposed exterior surface of said first region comprising said first conductivity type and the second opposed exterior surface of said second region comprising said second conductivity type, isolating means on said second exterior surface separating said first region from said second region, a first electrode contacting portions of said first exterior surface of each of said first and second regions to form a gate, a second electrode contacting portions of said first exterior surface of each of said first and second regions to form a first anode, a third electrode contacting said second opposed surface of both said first and second regions to form a second anode, means for generating biasing and control electrical signals, and said switch when connected to receive the electrical biasing and control signals generating switching currents during operation.

5. A bidirectional gated semiconductor switch having symmetrical switching operation but nonsymmetrical construction comprising:

a body of semiconductor material having five layers of alternating types of conductivity material to form a plurality of P-N junctions, the outer layers of said body comprising N type material, first and second layers of P+ type semiconductor material being formed in portions of one of said outer layers of N type material, said first and second layers extending to the exterior surface of said outer layer and being spaced apart by areas of N type material of said outer layer, a groove in the outer surface of said outer layer separating said first and second layers of P+ material, a gate electrode contacting said first layer of P+ type and said outer layer of N type, a first anode electrode contacting said second layer of P+ type and said outer layer of N type, a third layer of P+ type semiconductor material formed in the other of said outer layers of N type material and encompassing only a portion of the outer surface of said other outer layer, a groove in the outer surface of said other outer layer separating said third layer of P+ material from a portion of said other outer layer, said body thus formed including one portion having six layers of alternating opposite conductivity types and a second portion having seven layers of alternating opposite conductivity types, said switch operable in response to electrical signals applied to said electrodes to provide bidirectional symmetrical switching action at a high commutating rate, and a second anode electrode contacting said third layer and said other outer layer.

6. The bidirectional gated semiconductor switch of claim 5 and further comprising:

regions of N+ material forming the outer surfaces of said outer layers of N type material.

* * * * *